(12) United States Patent
Yu

(10) Patent No.: US 6,509,253 B1
(45) Date of Patent: Jan. 21, 2003

(54) T-SHAPED GATE ELECTRODE FOR REDUCED RESISTANCE

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/785,680

(22) Filed: Feb. 16, 2001

(51) Int. Cl.[7] .................. H01L 21/3205; H01L 21/4763
(52) U.S. Cl. ...................... 438/585; 438/574; 438/579; 438/588; 438/592
(58) Field of Search ................................ 438/574, 585, 438/579, 588, 592, 291, 181, 182, 528

(56) References Cited

U.S. PATENT DOCUMENTS

| | | |
|---|---|---|
| 4,714,519 A | 12/1987 | Pfiester |
| 4,745,082 A | 5/1988 | Kwok |
| 4,784,718 A | 11/1988 | Mitani et al. |
| 5,264,382 A | 11/1993 | Watanabe |
| 5,336,903 A * | 8/1994 | Ozturk et al. .................. 257/19 |
| 5,374,575 A | 12/1994 | Kim et al. |
| 5,391,510 A | 2/1995 | Hsu et al. |
| 5,429,956 A | 7/1995 | Shell et al. |
| 5,633,177 A * | 5/1997 | Anjum ......................... 438/301 |
| 5,675,159 A | 10/1997 | Oku et al. |
| 5,716,861 A | 2/1998 | Moslehi |
| 5,856,225 A | 1/1999 | Lee et al. |
| 5,858,843 A | 1/1999 | Doyle et al. |
| 5,955,759 A | 9/1999 | Ismail et al. |
| 5,998,285 A * | 12/1999 | Chou .......................... 438/585 |
| 6,284,613 B1 * | 9/2001 | Subrahmanyam et al. .. 438/307 |
| 6,309,933 B1 * | 10/2001 | Li et al. ...................... 438/291 |
| 6,326,290 B1 * | 12/2001 | Chiu .......................... 438/592 |

FOREIGN PATENT DOCUMENTS

| | | |
|---|---|---|
| JP | 3-248433 | 11/1991 |
| JP | 4-123439 | 4/1992 |
| JP | 5-160396 | 6/1993 |

OTHER PUBLICATIONS

"Ultra–Thin–Body Silicon–On–Insulator MOSFET's for Terabit–Scale Integration" by Yu, et al, Department of Electrical Engineering & Computer Sciences.

"Sub 50–nm FinFET: PMOS" by Huang, et al. Department of Electrical Engineering and Computer Sciences, IEEE, 1999.

"Sub–100nm Gate Length Metal Gate NMOS Transistors Fabricated by a Replacement Gate Process" By Chatterjee, et al., IEEE, 1997.

* cited by examiner

*Primary Examiner*—Richard Elms
*Assistant Examiner*—Michael K. Luhrs
(74) *Attorney, Agent, or Firm*—Foley & Lardner

(57) ABSTRACT

An integrated circuit includes a transistor with a T-shaped gate conductor. The T-shaped gate conductor can achieve a lower sheet resistance characteristic. The transistor can include a silicided source region, a silicided drain region, and a gate structure having the T-shaped gate conductor. The T-shaped gate conductor has a silicided top portion. The silicided top portion can have different silicidation characteristics than the silicided source region and the silicided drain region.

20 Claims, 4 Drawing Sheets

T-SHAPED GATE ELECTRODE FOR REDUCED RESISTANCE

CROSS REFERENCE TO RELATED APPLICATIONS

This application is related to U.S. patent application Ser. No. 09/372, 705, filed on Aug. 11, 1999 by Yu et al., entitled "Integrated Circuit Having Transistors with Different Threshold Voltages". This application is also related to U.S. Pat. No. 6,127,216, issued on Oct. 3, 2000, entitled "Heavily-doped Polysilicon/Germanium Thin Film Formed by Laser Annealing" and U.S. patent application Ser. No. 09/372,705 filed by Yu on Aug. 11, 1999, entitled "A Transistor with Dynamic Source/Drain Extensions."

FIELD OF THE INVENTION

The present invention relates generally to an integrated circuit (IC) and the fabrication of an integrated circuit. More particularly, the present invention relates to an integrated circuit having transistors with gate conductors having reduced resistance.

BACKGROUND OF THE INVENTION

Transistors are generally complementary metal oxide semiconductor field effect transistors (MOSFETs). An exemplary drawing of a conventional transistor is shown in FIGS. 1 and 2. A transistor 100 includes a gate conductor 102 disposed between a source region 108 and a drain region 110. Source region 108 and drain region 110 are formed in a semiconductor substrate 114.

Gate conductor 102 is provided over a thin gate oxide material 104. Gate conductor 102 can be a metal, polysilicon, polysilicon/germanium ($Si_xGe_{(1-x)}$) material that controls charge carriers in a channel region 116 between the drain and the source to turn the transistor on and off. The transistors can be N-channel MOSFETs or P-channel MOSFETs.

Generally, it is desirous to manufacture smaller transistors to increase the component density on an integrated circuit. For example, gate conductors, conductive lines, vias, doped regions, and other structures associated with an integrated circuit can all be reduced in size to increase component density. As transistors are reduced in size (CMOS scaling), resistance associated with conductive elements has increases.

When certain conductive structures, such as, gate conductors, are reduced in size, the cross-sectional dimensions are also reduced. For example, as gate widths become smaller, the cross-sectional width of the gate conductor becomes smaller. Further, as the thickness of layers becomes smaller, the height of gate conductors is decreased. Therefore, reduction in size of the gate conductor reduces the cross-sectional area of the conductor.

A reduction in cross-sectional dimensions increases the resistive characteristics of the gate conductor (e.g., sheet resistance). As the size of features on the integrated circuit reach sizes below 50 nanometers, gate conductor resistance becomes a larger problem at gate lengths of less than 50 nm. Higher resistance results in a greater voltage drop across gate conductor 102. The greater voltage drop degrades speed and increases the amount of power consumed by transistor 100.

Gate resistance can be manifested in at least two fashions across gate conductor 102. First, increased series resistance from a top surface 122 to a bottom surface 124 is disadvantageous because of the increased voltage drop. Further, the resistance between a gate contact and surface 102 can add to this resistance. Second, increased resistance from end 130 to another end 132 of gate conductor 104 can increase the voltage drop between ends 130 and 132. This resistance also can increase the voltage drop associated with gate conductor 102, thereby degrading speed and increasing the amount of power consumed by transistor 100.

Heretofore, a silicide layer has been provided on surface 122 to reduce series resistance associated with gate conductor 102. The silicide layer is simultaneously provided on source region 108, drain region 110 and gate conductor 102. A low thermal budget is utilized in post-source region 108 and drain region 110 processes to reduce dopant diffusion and preserve shallow junction formation. Accordingly, the silicide layers for drain region 108 and source region 110 and consequently gate conductor 102 are formed in a less silicon consuming fashion. Accordingly, conventional processes cannot utilize a thicker silicide region to achieve smaller series resistance in the gate conductor.

Further, resistance problems can be exacerbated by dopant activation and diffusion phenomena associated with the gate conductor. Low dopant activation diffusion can be related to the low thermal budget required to maintain shallow junction formation. Low levels of active dopant in the gate conductor increase the resistance of the gate conductor.

The dopant concentration near the gate electrode/gate oxide interface is often relatively low. The relatively low dopant concentration near the gate electrode/the gate oxide interface is referred to as "gate depletion-effect" and is a major problem in complimentary MOS (CMOS) processes which manufacture small-scale transistors. Polysilicon/ germanium gate conductors have been employed to reduce gate depletion effect.

Thus, there is a need for a transistor which has reduced gate resistance. Further still, there is a need for a transistor with reduced gate sheet resistance. Further still, there is a need for a process that more effectively suicides the gate conductor. Even further still, there is a need for a method of making a novel transistor structure which is less susceptible to gate resistance and yet has an acceptable size. Even further still, there is a need for a germanium, polysilicon, or polysilicon/germanium gate conductor that can be efficiently manufactured and yet has reduced resistance.

SUMMARY OF THE INVENTION

An exemplary embodiment relates to a method of manufacturing an integrated circuit. The method includes providing an insulative layer above a gate structure and a top surface of a substrate, removing the insulative layer to expose the gate structure, providing a gate conductor layer above a top surface of the insulative layer, and etching the gate conductor layer to form a T-shaped gate conductor. The top surface of the substrate includes a silicided drain region. The gate structure has a top surface above a top surface of the insulative layer after the insulative layer is removed.

Another exemplary embodiment relates to a method of manufacturing an ultra-large scale and engraved circuit. The integrated circuit includes a transistor with a T-shaped gate conductor. The method includes steps of: providing an insulative layer above a gate structure on a top surface of a substrate, reducing a thickness of the insulative layer, and providing a second gate conductor. The gate structure includes a first gate conductor having a rectangular-shaped cross section of a first width. The thickness of the insulative layer is reduced until a top surface of the first gate conductor is above a top surface of the insulative layer. The second gate conductor is provided above the first gate conductor to form the T-shaped gate conductor. The T-shaped gate conductor has a second width at a top surface more than the first width.

Another exemplary embodiment relates to a transistor. The transistor includes a silicided source region, a silicided drain region, and a gate structure. The gate structure has a T-shaped conductor. The T-shaped conductor has a silicided top portion. The silicided top portion has different silicidation characteristics than the silicided source region and the silicided drain region.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
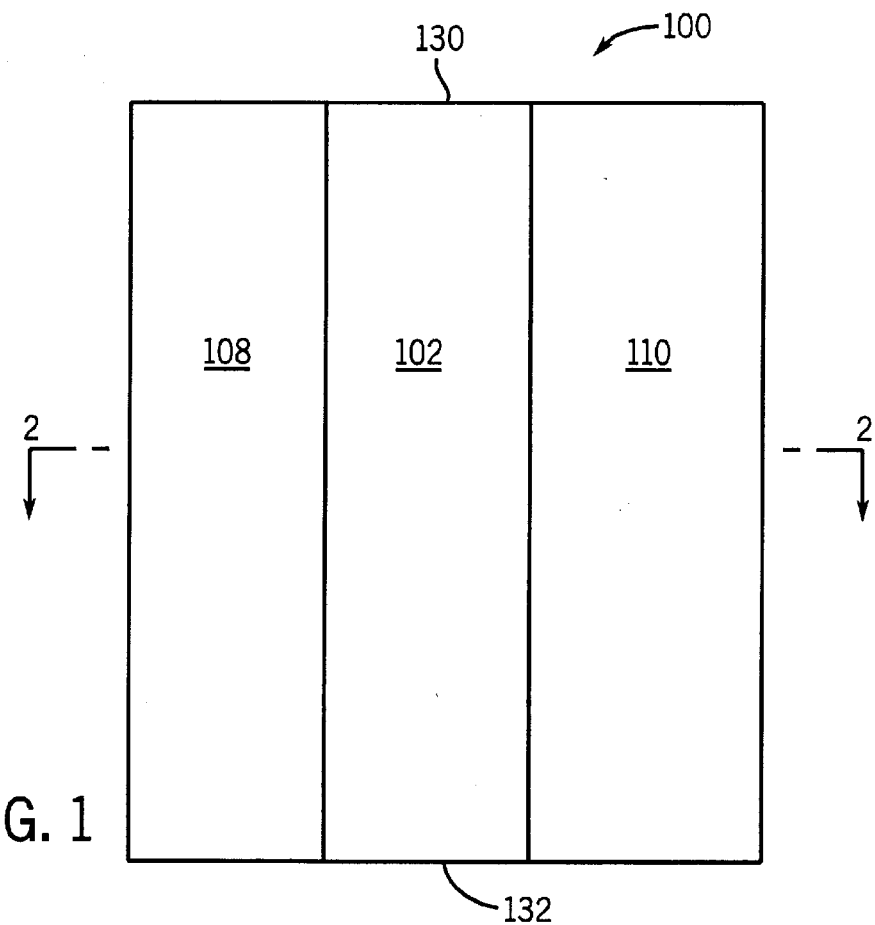
FIG. 1 is a schematic top planar view drawing of a conventional transistor.
Figure 2:
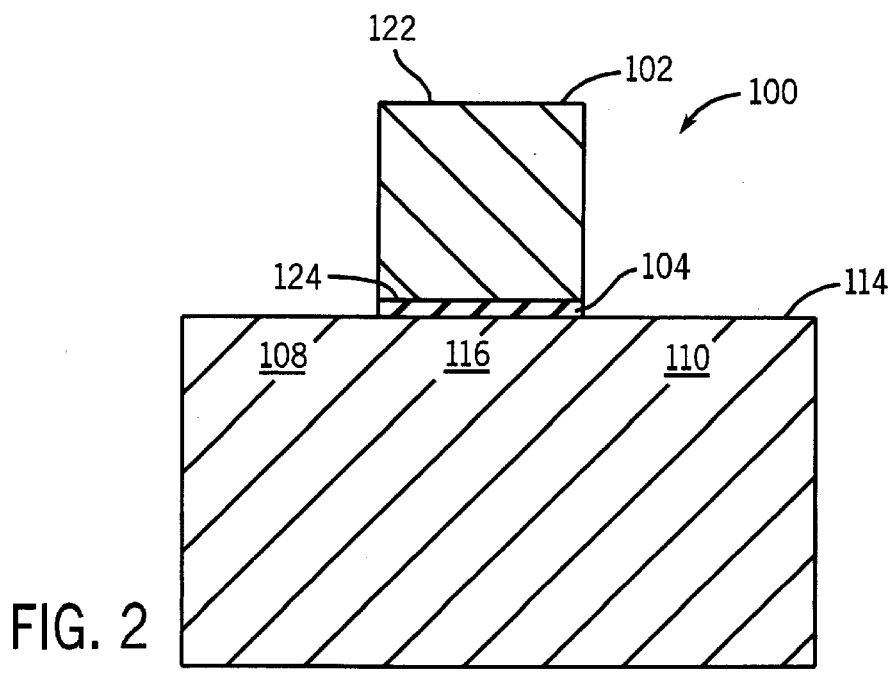
FIG. 2 is a schematic cross-sectional view drawing of the transistor illustrated in FIG. 1 about line 2—2.
Figure 3:
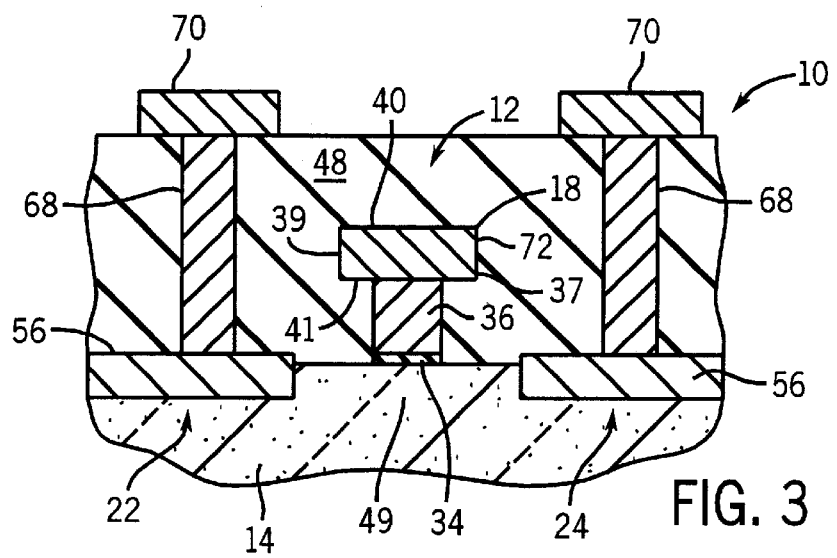
FIG. 3 is a schematic cross-sectional view drawing of a portion of an integrated circuit including a transistor with a T-shaped gate electrode in accordance with an exemplary embodiment.

With reference to FIG. 3, a portion 10 of an integrated circuit (IC) includes a transistor 12 which is disposed on a semiconductor substrate 14, such as, a wafer. Semiconductor substrate 14 is preferably a bulk P-type silicon substrate. Alternatively, substrate 14 can be any type of IC substrate including a gallium arsenide (GaAs), germanium, or a semiconductor-on-insulator (SOI) substrate (e.g., a silicon-on-glass substrate).

Transistor 12 can be a P-channel or N-channel metal oxide semiconductor field effect transistor (MOSFET) and is described below as an N-channel transistor. Transistor 12 includes a gate structure 18, a silicided source region 22, and a silicided drain region 24. For an N-channel transistor, regions 22 and 24 are heavily doped with N-type dopants (e.g., $5\times10^{19}$–$1\times10^{20}$ dopants per cubic centimeter). For a P-channel transistor, regions 22 and 24 are heavily doped with P-type dopants ($5\times10^{19}$–$1\times10^{20}$ dopants per cubic centimeter). An appropriate dopant for a P-channel transistor is boron, boron diflouride, or iridium, and an appropriate dopant for an N-type transistor is arsenic, phosphorous, or antimony.

Source and drain regions 22 and 24 can be provided with extensions. Preferably, ultra-shallow extensions (e.g., junction depth is less than 20 nanometers (nm), 100–250 Å) are integral with regions 22 and 24. The source and drain extensions can be disposed partially underneath gate structure 18.

A channel region 49 underneath gate structure 18 separates regions 22 and 24. Region 49 can be doped according to device parameters. For example, region 49 can be doped according to a super steep retrograded well region.

Gate stack or structure 18 includes a T-shaped conductor 37, and a gate dielectric layer 34, T-shaped conductor 37 has a top portion 39 and a bottom portion 36. Bottom portion 36 has a smaller width than top portion 39. Preferably, the width of the bottom portion 36 is 250–1500 Å and the width of top portion 39 is 1000–3000 Å. Bottom portion 36 is preferably 500–2000 Å in height and top portion 39 is preferably 500–2000 Å in height.

Top portion 39 of T-shaped gate conductor 37 is preferably entirely silicided from a top surface 40 to a bottom surface 41. As shown in FIG. 3, top portion 39 is comprised of a silicide layer 72.

Dielectric layer 34 is preferably a 15 to 30 thick thermally grown silicon dioxide layer. Alternatively, layer 34 can be a silicon nitride layer. Dielectric layer 34 can be comprised of a high-k dielectric material such as a 2–10 nm thick conformal layer of tantalum pentaoxide ($Ta_2O_5$), aluminum oxide ($Al_2O_3$), titanium dioxide ($TiO_2$) or other material having a dielectric constant (k) over 8.

T-shaped gate conductor 37 is preferably a semiconductive material. According to one embodiment, conductor 37 can be a polysilicon, germanium, or a silicon/germanium material. T-shaped gate conductor 37 is also preferably heavily doped with an n-type dopant, such as phosphorous (P), arsenic (As) or other dopant. Alternatively, gate conductor 37 can be doped with a P-type dopant, such a boron (B), boron diflouride ($BF_2$), or other dopants.

T-shaped gate conductor 37 can be implanted with dopants or with other semiconductive materials or can be an in situ doped material. In one embodiment, gate conductor 37 is polysilicon implanted with an atomic percentage of 10–50%. The silicon/germanium material is heavily doped (P+) with P-type dopants. According to another embodiment, T-shaped conductor 37 can be a metal material.

A suicide layer 56 is disposed above source region 22 and drain region 24. Preferably, layer 56 is a nickel suicide ($WSi_x$). Alternatively, layer 56 can be any type of refractory metal and silicon combination, such as, a cobalt silicide, tungsten silicide, titanium silicide, or other silicide material. Preferably, layer 56 is 150–300 Å thick. Metal contacts 68 can be coupled to layer 56 through an insulating layer 48 to connect regions 22 and 24 to conductive lines 70.

Transistor 12 can be an N-channel or a P-channel field effect transistor, such as, a metal oxide semiconductor field effect transistor (MOSFET). Transistor 12 is at least partially covered by insulative layer 48 and is preferably part of an ultra-large scale integrated (ULSI) circuit that includes one million or more transistors.

Silicide layer 72 can be the same material or different material than silicide layer 56. Any conventional silicide material can be utilized including tungsten silicide, cobalt silicide, titanium silicide, nickel silicide, depending upon process parameters and design criteria. Preferably, a low temperature silicide region is utilized for layer 56 (e.g., nickel silicide) and a higher temperature silicide process (e.g., cobalt silicide) is utilized for layer 72. For example, layer 72 can be 200–400 Å thick.

Layer 72 can be thicker than layer 56 to reduce resistance associated with T-shaped conductor 37. Alternatively, the thickness of layers 72 and 56 can be the same. Therefore, the silicidation characteristic associated with layers 56 and T-shaped conductor 72 can be different, thereby ensuring shallow junction formation and reducing gate resistance.

With reference to FIGS. 3–10, an advantageous process of forming transistor 12 is described below. The process advantageously provides a novel fabrication flow in which layers 56 and 72 are formed separately. Preferably, layer 56 is formed before layer 72. In addition, the process flow forms a T-shaped semiconductor gate electrode, such as, T-shaped gate conductor 37.

Figure 4:
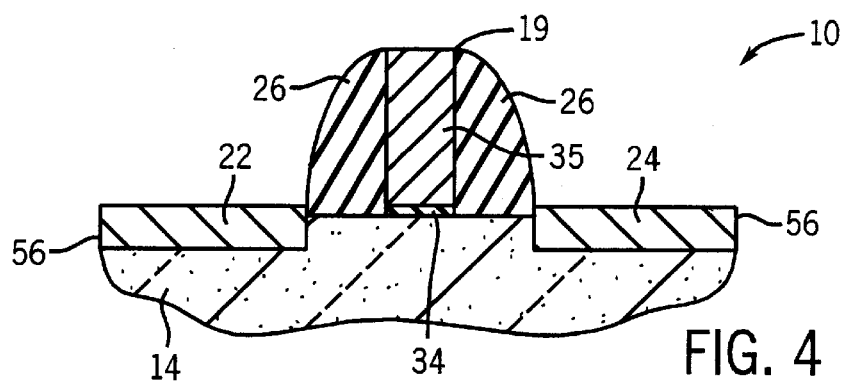
FIG. 4 is a schematic cross-sectional view drawing of the portion of the integrated circuit illustrated in FIG. 1, showing a gate structure formation step and a silicidation step.

With reference to FIG. 4, substrate 14 includes silicided source region 22 and silicided drain region 24. Gate structure 19 includes a gate conductor 35, gate dielectric 34, and spacers 26. A conventional gate structure formation process can be utilized to provide gate structure 19 above substrate 14. For example, a gate stack including a layer of material for gate conductor 35 and gate dielectric 34. can be selectively etched to create gate dielectric 34 and gate conductor 35. Preferably, spacers 26 are silicon dioxide ($SiO_2$) spacers formed in conventional chemical vapor deposition (CVD) and etch back process. Gate conductor 35 and dielectric layer 34 can be formed in a conventional deposition and selective etching process.

Preferably, regions 22 and 24 include a suicide layer 56. Silicide layer 56 can be NiSi, $CoSi_2$, $TiSi_2$ material and can be 200–400 Å thick. Layer 56 can be any type of refractory metal and silicon combination, such as cobalt, silicide, nickel suicide, or other silicide material. Layer 56 is preferably formed in a self-aligned silicidation process after gate structure 19 is provided to substrate 14 and after spacers 26 are provided.

Layer 56 can be formed in a conventional low temperature process above substrate 14. According to one embodiment, a silicide refractory metal (e.g., nickel) is deposited on a top surface of substrate 14 and substrate 14 is heated to form layer 56. Layer 56 consumes 30–50 percent of its thickness from substrate 14. A conventional silicidation process can be utilized to form layer 56 associated with source and drain regions 22 and 24.

Conventional doping and implanting processes can be utilized to form regions 22 and 24. For example, an amorphization and dopant implant process can form deep source and drain regions after spacers 26 are formed. Shallow extensions can be formed in a similar process before spacers 26 are formed and after gate conductor 35 and gate dielectric 34 are formed.

Figure 5:
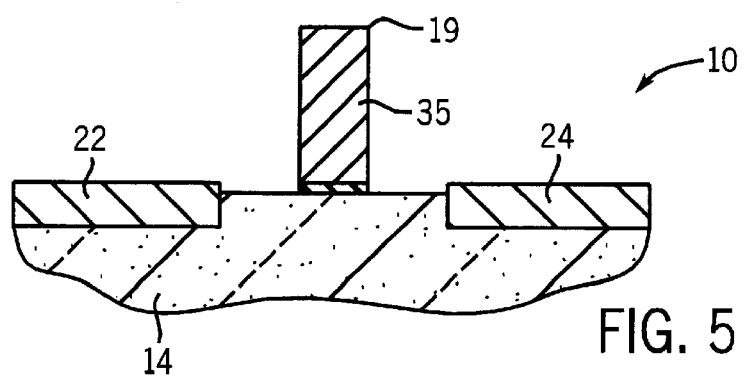
FIG. 5 is a schematic cross-sectional view drawing of the portion of the integrated circuit illustrated in FIG. 4, showing a stripping step.

With reference to FIG. 5, spacers 26 are stripped by dry plasma etching. Preferably, spacers 26 are stripped in a process selective to silicon dioxide and not selective to the polysilicon associated with conductor 35, not selective to the single crystal silicon associated with substrate 14, and not selective to the suicide associated with layer 56.

Figure 6:
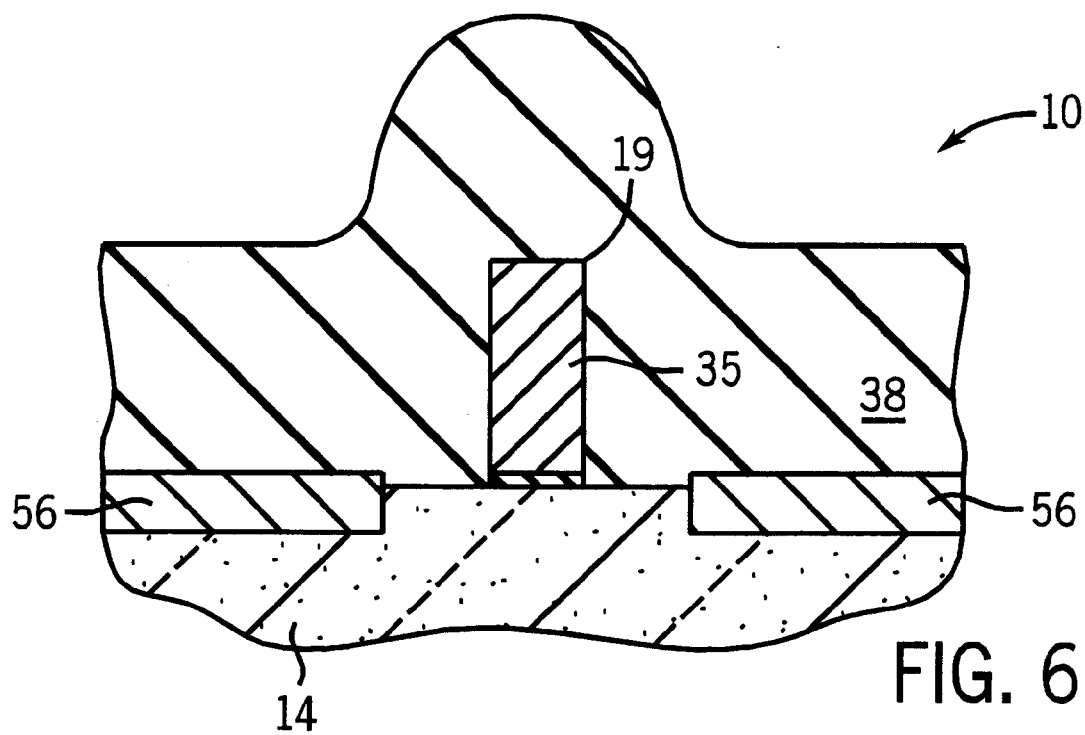
FIG. 6 is a schematic cross-sectional view drawing of the portion of the integrated circuit illustrated in FIG. 5, showing an insulative layer deposition step.

With reference to FIG. 6, an insulative layer 38 can be provided over gate structure 19, layer 56, and substrate 14. Preferably, layer 38 is a 3000–5000 Å thick insulative layer, such as an oxide material. Alternatively, layer 38 can be a composite of insulative materials or other insulative materials. Layer 38 can be an insulative materials including silicon nitride ($Si_3N_4$).

Layer 38 can be silicon dioxide ($SiO_2$) deposited at low temperature by plasma-enhanced chemical vapor deposition (PECVD). Alternatively, layer 38 can be a composite of several layers of insulative materials. After deposition, layer 38 can be planarized in a chemical-mechanical polish (CMP) process.

Figure 7:
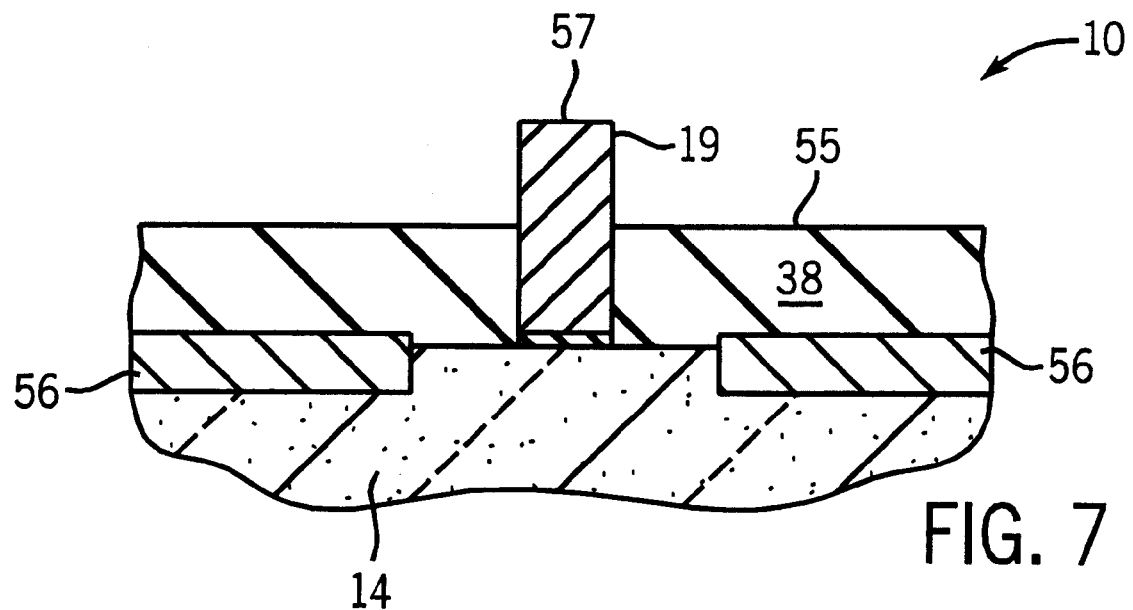
FIG. 7 is a schematic cross-sectional view drawing of the portion of the integrated circuit illustrated in FIG. 6, showing a polishing step.

With reference to FIG. 7, insulative layer 38 is partially removed. Preferably, layer 38 is removed so that a top surface 55 is below a top surface 57 of gate structure 19. Layer 38 can be removed by wet or dry etching, Preferably, the etching process is selected to the material of layer 38 (oxide material) with respect to polysilicon to expose gate structure 19. Preferably, top surface 57 of gate structure 19 is 200–400 Å above top surface 55 of insulative layer 38 after the etching step.

Figure 8:
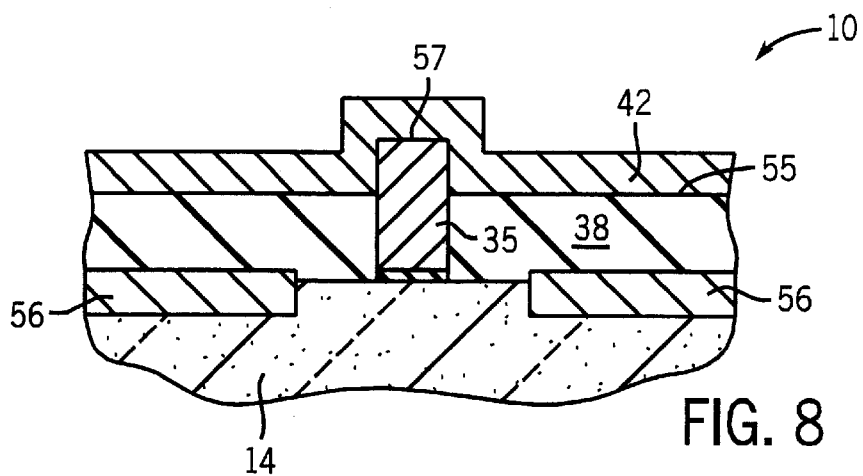
FIG. 8 is a schematic cross-sectional view drawing of the portion of the integrated circuit illustrated in FIG. 7, showing a gate conductor deposition step.

With reference to FIG. 8, a gate conductor layer 42 is deposited above insulative layer 38. Preferably, layer 42 is deposited on top surface 55 of layer 38 and top surface 57 of gate conductor 35. Layer 42 can be a 800–1500 Å thick insitu doped polysilicon layer. An additional masking step can be utilized to provide different types of dopants for layer 42, one type of dopant in N-channel MOSFETs areas of the integrated circuit and another type of dopant in P-channel MOSFETs areas of the integrated circuit. Layer 42 can be deposited by CVD. Layer 42 is preferably deposited so that sufficient contact is made between layer 42 and conductor 35.

Figure 9:
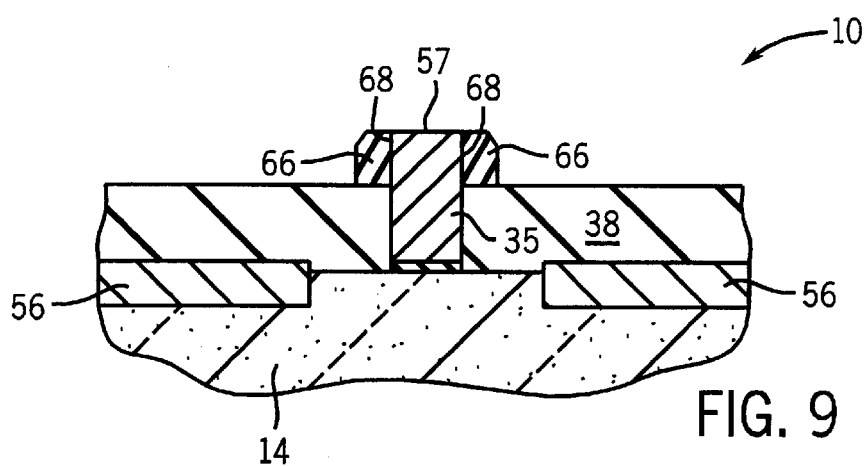
FIG. 9 is a schematic cross-sectional view drawing of the integrated circuit illustrated in FIG. 8, showing an etching step.

With reference to FIG. 9, layer 42 is masked and etched in a lithographic process. Preferably, an etch-back process is utilized to leave spacers 66 abutting sidewalls 68 of gate conductor 35. Preferably, top surface 57 of gate conductor 35 is exposed in the etch-back process. The etch-back process forms a T-shaped structure (T-shaped gate conductor 37 (FIG. 3)).

Spacers 66 can be 200–500 Å wide and 200–400 Å thick depending upon design criteria and applications. For example, spacers 66 should be designed so they do not extend and interfere with contacts 68 (FIG. 3) provided to layers 56 associated with source region 22 and drain region 24.

Figure 10:
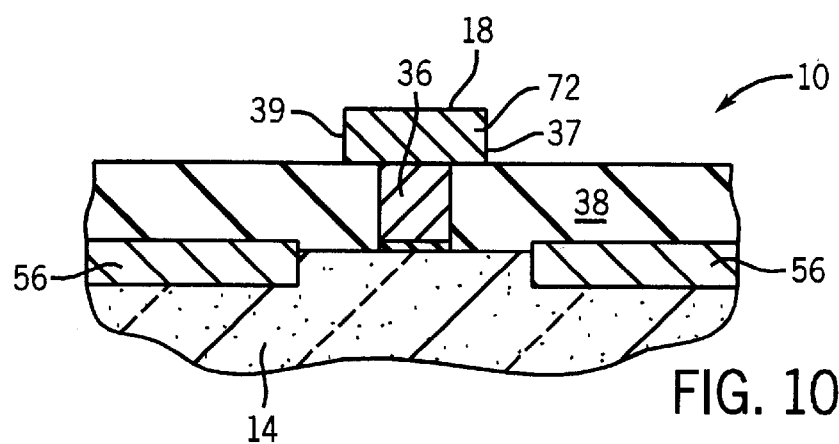
FIG. 10 is a schematic cross-sectional view drawing of the integrated circuit illustrated in FIG. 9, showing a silicidation step.

With reference to FIG. 10, spacers 66 and a top portion of T-shaped conductor 37 are silicided to form a silicide layer 72. Preferably, silicide layer 72 has different silicidation characteristics than layer 56. Preferably, silicide layer 72 is thicker than layer 56 and can be manufactured from a different material than layer 36. Exemplary materials for layer 72 include NiSi, $CoSi_2$, $TiSi_2$. Preferably, the entire thickness of spacer 66 is consumed by layer 72. The thicker silicided layer 72 provides significant advantages with respect to resistance of T-shaped gate conductor 18 (FIG. 3).

With reference to FIG. 3, after silicide layer 72 is formed, an additional insulative layer can be deposited above layer 38. The additional insulative combined with layer 38 forms layer 48. (FIG. 3). After layer 48 is formed, conventional contact and interconnect layer processes can be utilized to provide connections to layers 56. Convention MOSFETs fabrication processes can be utilized to form other interconnections and other devices necessary for portion 10 of the integrated circuit.

It is understood that while preferred embodiments and specific examples are given, they are for the purpose of illustration only and are not limited to the precise details disclosed. Various modifications may be made in the details within the scope and range of equivalents of the claims without departing from what is claimed.

What is claimed is:

1. A method of manufacturing an integrated circuit, comprising:

a providing a gate structure on a top surface of a substrate, the gate structure including a first gate conductor between a pair of spacers;

siliciding the substrate to form a silicided source and silicided drain;

removing the spacers;

providing an insulative layer above the gate structure and the top surface of the substrate;

removing the insulative layer to expose the gate structure, the gate structure having a top surface above a top surface of the insulative layer;

providing a gate conductor layer above the top surface of the insulative layer; and etching the gate conductor layer to form a T-shaped gate conductor.

2. The method of claim 1 further comprising: siliciding at least a portion of the T-shaped gate conductor.

3. The method of claim 2, wherein siliciding consumes the entire gate conductor layer.

4. The method of claim 2, wherein the portion of the T-shaped conductor has a different silicidation characteristic than the silicided drain region.

5. The method of claim 4, wherein the different silicidation characteristic includes thickness.

6. The method of claim 4, wherein the different silicidation characteristic includes material.

7. The method of claim 1, wherein the gate structure includes germanium.

8. The method of claim 1, wherein the gate conductor layer includes polysilicon or germanium.

9. The method of claim 1, wherein a width of the T-shaped gate conductor is at least 1000 Å at a widest point and less than 1200 Å at a narrowest point, the widest point being wider than the narrowest point.

10. A method of manufacturing an ultra-large scale integrated circuit including a transistor with a T-shaped gate conductor, the method comprising steps of;

providing a gate structure including a first gate conductor and a first spacer and a second spacer, the first gate conductor being above a channel between a source and drain;

siliciding the source and the drain;

removing the first spacer and the second spacer;

providing an insulative layer above the first gate conductor and the source and the drain, the first gate conductor having a rectangular-shaped cross-section of a first width;

reducing a thickness of the insulative layer until a top surface of the first gate conductor is above a top surface of the insulative layer; and providing a second gate conductor above the first gate conductor to form the T-shaped gate conductor, the T-shaped gate conductor having a second width more than the first width at a top surface.

11. The method of claim 10, further comprising: siliciding the second gate conductor.

12. The method of claim 11, wherein the second gate conductor is entirely silicided.

13. The method of claim 11, wherein the second width is at least 1000 Å.

14. The method of claim 13, wherein the first width is less than 1500 Å.

15. The method of claim 11, wherein the first and second gate conductors include germanium.

16. A method of manufacturing a transistor including a silicided source region, a silicided drain region, and a final gate structure, wherein the final gate structure includes a T-shaped gate conductor, the T-shaped gate conductor having a silicided top portion, the silicided top portion having different silicidation characteristics than the silicided source region and the silicided drain region, the method comprising:

providing a first gate structure above a substrate, the first gate structure including a first gate conductor between a pair of spacers;

siliciding to form the silicided source region and the silicided drain region;

removing the spacers;

providing an insulative layer above the first gate structure and the silicided source region and the silicided drain region;

removing the insulative layer to expose the first gate structure, the first gate structure having a top surface above a top surface of the insulative layer;

providing a gate conductor layer above the top surface of the insulative layer;

etching the gate conductor layer to form the T-shaped gate conductor; and siliciding the T-shaped gate conductor to form the silicided top portion.

17. The method of claim 16, wherein the different silicidation characteristics include thickness.

18. The method of claim 16, wherein the different silicidation characteristicd include material.

19. The method of claim 16, wherein the silicided top portion is entirely silicided.

20. The method of claim 16, wherein the silicided top portion is thicker than on a silicided portion of the silicided source region and the silicided drain region.

* * * * *